(12) United States Patent
Kim et al.

(10) Patent No.: US 9,351,435 B2
(45) Date of Patent: May 24, 2016

(54) BONDING APPARATUS AND METHOD FOR DISPLAY DEVICE

(71) Applicants: Jong-Hwan Kim, Yongin (KR); Yong-Youl Cho, Yongin (KR)

(72) Inventors: Jong-Hwan Kim, Yongin (KR); Yong-Youl Cho, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 305 days.

(21) Appl. No.: 13/855,863

(22) Filed: Apr. 3, 2013

(65) Prior Publication Data

US 2013/0299086 A1    Nov. 14, 2013

(30) Foreign Application Priority Data

May 14, 2012  (KR) .................. 10-2012-0050944

(51) Int. Cl.

| | |
|---|---|
| H05K 13/04 | (2006.01) |
| B23K 20/00 | (2006.01) |
| B23K 20/02 | (2006.01) |
| B23K 20/233 | (2006.01) |
| H05K 3/36 | (2006.01) |

(52) U.S. Cl.
CPC ............ H05K 13/046 (2013.01); B23K 20/002 (2013.01); B23K 20/02 (2013.01); B23K 20/233 (2013.01); B23K 2201/42 (2013.01); H05K 3/361 (2013.01)

(58) Field of Classification Search
CPC . H05K 13/046; H05K 3/361; B23K 2201/42; B23K 20/02; B23K 20/233; B23K 20/002
USPC ........................... 156/308.2, 583.1, 562, 580
See application file for complete search history.

(56) References Cited

U.S. PATENT DOCUMENTS

| | | | |
|---|---|---|---|
| 2007/0084566 A1* | 4/2007 | Seki et al. .................. | 156/583.1 |
| 2010/0243153 A1* | 9/2010 | Onitsuka et al. ............. | 156/290 |
| 2011/0180210 A1* | 7/2011 | Mori et al. .................... | 156/297 |

FOREIGN PATENT DOCUMENTS

| | | |
|---|---|---|
| KR | 10-2008-0019896 A | 3/2008 |
| KR | 10-0848937 B1 | 7/2008 |
| KR | 10-2009-0062063 A | 6/2009 |

* cited by examiner

*Primary Examiner* — Jacob T Minskey
*Assistant Examiner* — Vishal I Patel
(74) *Attorney, Agent, or Firm* — Lee & Morse, P.C.

(57) ABSTRACT

A bonding apparatus for a display device includes a film bonding device configured to attach an anisotropic conductive film to a panel, and a pressure device configured to bond a driving chip and a flexible printed circuit to the panel. The pressure device includes a pressure head including a heat source, a pressure tip attached to a bottom side of the pressure head and the pressure tip being configured to press the flexible printed circuit to the panel, and a transfer unit attached to an upper side of the pressure head, the transfer unit being configured to transfer the pressure head. The heat source is located in the pressure head.

13 Claims, 7 Drawing Sheets

BONDING APPARATUS AND METHOD FOR DISPLAY DEVICE

CROSS-REFERENCE TO RELATED APPLICATION

This application claims priority under 35 U.S.C. §119 to Korean Patent Application No. 10-2012-0050944 filed in the Korean Intellectual Property Office on May 14, 2012, the entire contents of which are incorporated herein by reference.

BACKGROUND

1. Field

Embodiments relate to a bonding apparatus for a display device and a method thereof.

2. Description of Related Art

In a film on glass (FOG) bonding process for module manufacturing of, for example, an organic light emitting diode (OLED) display, a liquid crystal display (LCD), and the like, a flexible printed circuit (FPC) is aligned with a panel to which an anisotropic conductive film (ACF) is attached. Then, a sheet is covered for heat dissipation and protection on an upper side of the FPC, and a location to be connected is pressed using a heat-applied pressure tip of a bonding apparatus for a display device for electric connection between the panel and an electrode of the FPC.

SUMMARY

Embodiments are directed to a bonding apparatus for a display device, including a film bonding device configured to attach an anisotropic conductive film to a panel, and a pressure device configured to bond a driving chip and a flexible printed circuit to the panel. The pressure device includes a pressure head including a heat source, a pressure tip attached to a bottom side of the pressure head and the pressure tip being configured to press the flexible printed circuit to the panel, and a transfer unit attached to an upper side of the pressure head, the transfer unit being configured to transfer the pressure head. The heat source is located in the pressure head.

The pressure head may be disposed at a position biased toward one side of the transfer unit with reference to a center axis of the transfer unit. The pressure head may overlap the pressure tip.

The bonding apparatus may further include a tip fixing member fixing the pressure tip to the pressure head. The tip fixing member may simultaneously contact a bottom side of the pressure head and a side of the pressure tip.

The bonding apparatus may further include an auxiliary pressure head extended in a horizontal direction from the pressure head and attached to the transfer unit. An auxiliary heat source is provided in the auxiliary pressure head. A bottom side of the auxiliary pressure head may be disposed higher than a bottom side of the pressure head. The auxiliary heat source may be disposed higher than the heat source.

Embodiments are also directed to a film pressure method using a bonding apparatus for a display device. The method includes bonding a driving chip to a chip on glass bonding portion of a panel, positioning a flexible printed circuit on a film on glass bonding portion of the panel, and bonding the flexible printed circuit to the film on glass bonding portion of the panel using a pressure tip of the bonding apparatus for the display device. In the bonding of the flexible printed circuit, a heat source of a pressure head connected to the pressure tip of the bonding apparatus for the display device may be in a non-overlapping relationship with the chip on glass bonding portion. The heat source of the pressure head may be in a non-overlapping relationship with a film on glass bonding portion.

The pressure head of the bonding apparatus for the display device may be disposed at a position biased toward one side of the transfer unit with reference to a center axis of a transfer unit. The bonding apparatus may further include an auxiliary pressure head extended in a horizontal direction from the pressure head and having an auxiliary heat source provided therein. The auxiliary heat source may be disposed higher than the heat source.

The pressure tip may not overlap the chip on glass bonding portion.

BRIEF DESCRIPTION OF THE DRAWINGS

Features will become apparent to those of skill in the art by describing in detail exemplary embodiments with reference to the attached drawings in which.

DETAILED DESCRIPTION

Embodiments will be described more fully hereinafter with reference to the accompanying drawings, in which exemplary embodiments are shown. As those skilled in the art would realize, the described embodiments may be modified in various different ways, all without departing from the spirit or scope thereof.

Like reference numerals refer to like elements throughout the specification. The size and thickness of each component shown in the drawings are arbitrarily shown for better understanding and ease of description, and thus the embodiments not limited to those shown in the drawings.

Throughout the specification, it will be understood that when an element such as a layer, film, region, area or panel is referred to as being "on" another element, it can be directly on the other element or intervening elements may also be present.

Figure 1:
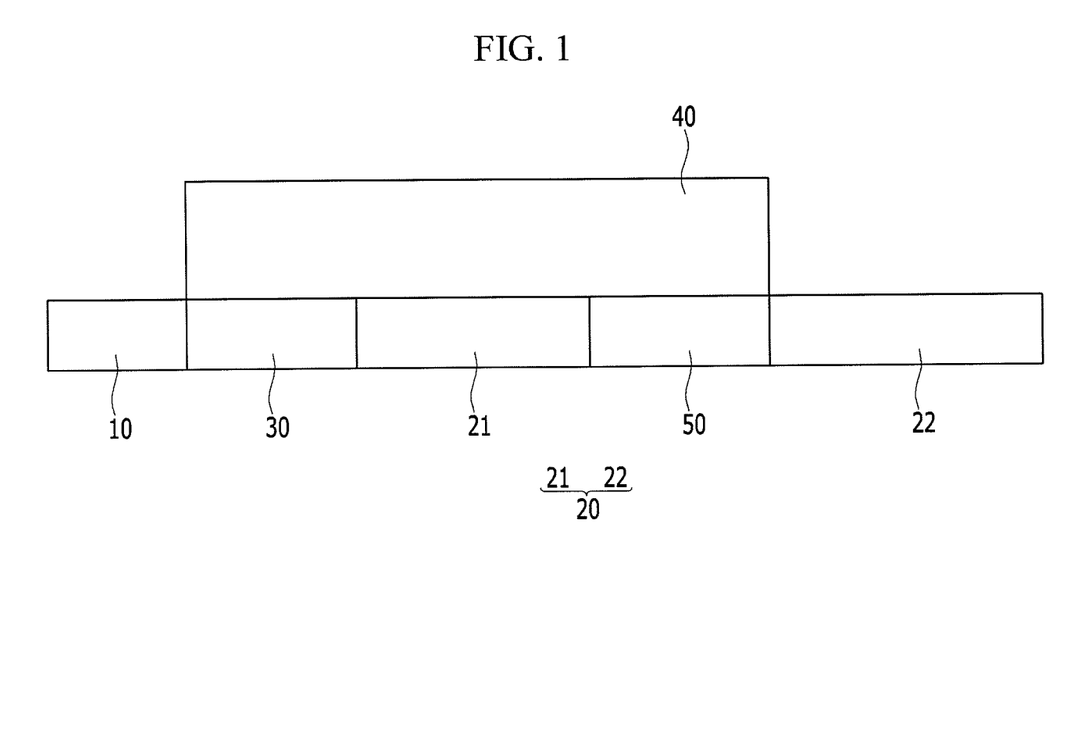
FIG. 1 is a schematic diagram of an entire bonding apparatus for a display device according to an exemplary embodiment.
Figure 2:
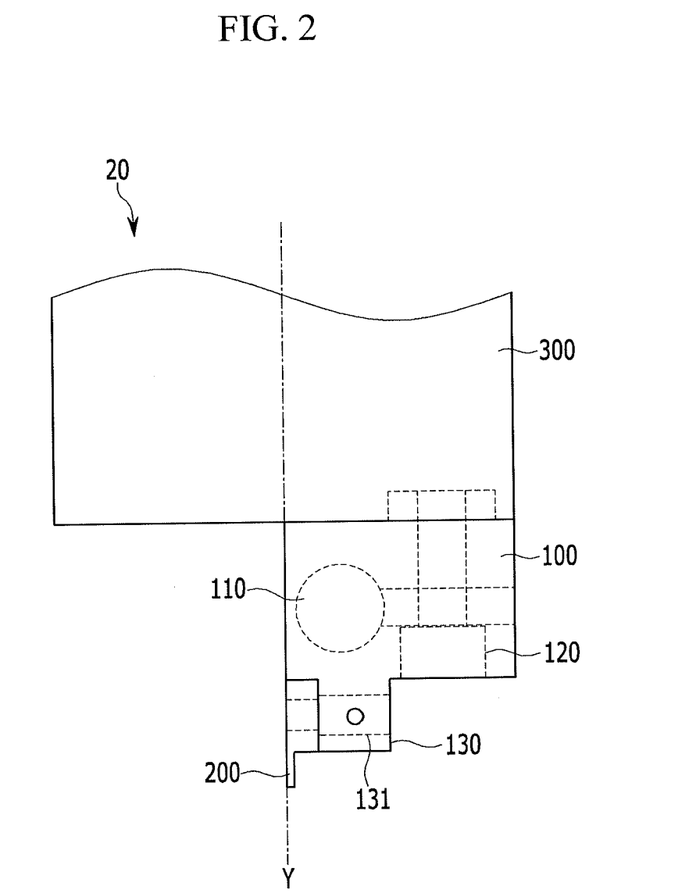
FIG. 2 is an enlarged side view of a pressure of the bonding apparatus for the display device according to the exemplary embodiment.
Figure 3:
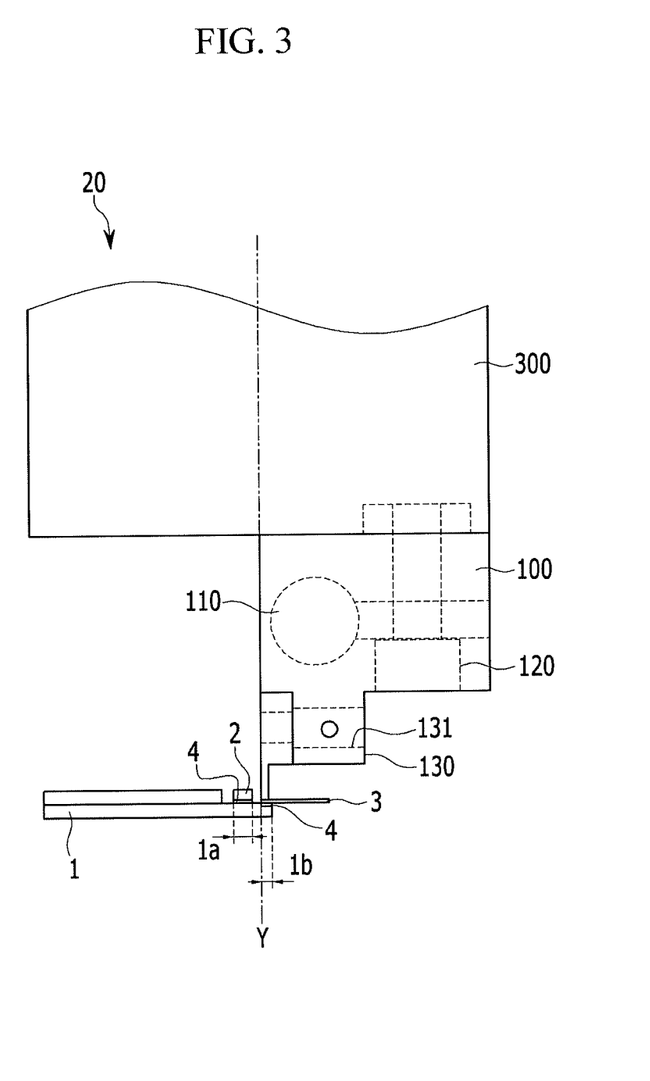
FIG. 3 is a side view of a bonding method using the bonding apparatus for the display device according to the exemplary embodiment.

FIG. 1 is a schematic diagram of a bonding apparatus for a display device according to an exemplary embodiment. FIG. 2 is an enlarged side view of a pressure device of the bonding apparatus for the display device according to the exemplary embodiment. FIG. 3 is a side view of a bonding method using the bonding apparatus for the display device according to the exemplary embodiment.

As shown in FIG. 1, a bonding apparatus for a display device according to the exemplary embodiment includes a film bonding device 10 attaching an anisotropic conductive film 4 to a panel 1 and a pressure device 20 bonding a driving chip 2 and a FPC 3 to the panel 1. (The panel 1, driving chip 2, FPC, and conductive film 4 are shown in FIG. 3.) In addition, the bonding apparatus further includes a film attachment tester 30 testing whether the anisotropic conductive film 4 is attached to the panel 1, an anisotropic conductive film loader 40 loading the anisotropic conductive film 4, and a bonding tester 50 testing whether a driving chip 2 and the FPC 3 are bonded to the panel 1. The pressure device 20 may include a provisional pressure device 21 performing a provisional pressure process and a main pressure device 22 performing a main pressure process. In the description below, the term "pressure device 20" may refer to either the provisional pressure device 21 or the main pressure device 22. Herein, the terms such as "upper" and "top" refer to a relative positioning farther away from a panel 1 to which a driving chip 2, FPC 3, and anisotropic conductive film 4 are attached, and terms such as "lower" and "bottom" refer to a relative positioning closer to the panel 1, particularly with reference to the center axis Y. Terms such as "horizontal" refer to a direction parallel to the panel 1, or, for example, in a direction perpendicular to the center axis Y.

As shown in FIG. 2, the pressure device 20 includes a pressure head 100 having a heat source 110 provided therein, a pressure tip 200 attached to a bottom side of the pressure head 100 and pressing the FPC 3 to the panel 1, and a transfer unit 300 attached to an upper side of the pressure head 100 and transferring the pressure head 100.

The heat source 110 of the pressure head 100 may be a heating coil. Heat generated from the heat source 110 is applied to the anisotropic conductive film 4 such that a film on glass bonding portion 1b of the panel 1 and the FPC 3 can be easily bonded with each other through the anisotropic conductive film 4.

The pressure head 100 is disposed at a position biased toward one side of the transfer unit 300 with reference to the center axis Y of the transfer unit 300. FIG. 2 illustrates that one end portion of the pressure head 100 matches the center axis Y of the transfer unit 300, but other configurations are possible.

The pressure head 100 overlaps the pressure tip 200. The heat source 110 provided in the pressure head 100 is disposed in an upper portion of the pressure head 100. Thus, during a film on glass bonding process, the chip on glass bonding portion 1a of the panel 1 is not disposed under the heat source 110, and heat generated from the heat source 110 is hardly transmitted to the chip on glass bonding portion 1a of the panel 1. Accordingly, the chip on glass bonding portion 1a may be prevented from being lifted.

In addition, the heat source 110 is disposed at a position biased toward one side of the transfer unit 300 with reference to the center axis Y of the transfer unit 300. Thus, the heat source 110 does not overlap the pressure tip 200, and therefore the film on glass bonding portion 1b of the panel 1 is not disposed under the heat source 110 during the film on glass bonding process. Accordingly, the heat source 110 can be prevented from influencing the film on glass bonding portion 1b.

Such a pressure head 100 is attached to the transfer unit 300 using a connection member 120. A tip fixing member 130 is further provided to fix the pressure tip 200 to the pressure head 100. The tip fixing member 130 simultaneously contacts a bottom side of the pressure head 100 and a side of the pressure tip 200 and fixes the tip fixing member 130 to the pressure tip 200 using a tip connection member 131. The tip fixing member 130 may be formed of the same material protruded from the pressure head 100, or may be formed of a member separated from the pressure head 100.

A bonding method using such a bonding apparatus for the display device according to the first exemplary embodiment will be described in further detail with reference to FIG. 3.

First, the driving chip 2 is bonded to the chip on glass bonding portion 1a of the panel 1. In this case, the film bonding device 10 and the pressure device 20 of the bonding apparatus for the display device according to the exemplary embodiment of FIGS. 1 and 2 are used.

Next, the FPC 3 is disposed in the film on glass bonding portion 1b of the panel 1. The anisotropic conductive film 4 is attached to the chip on glass bonding portion 1a and the film on glass bonding portion 1b of the panel 1, and the anisotropic conductive film 4 is formed of a double-sided adhesive tape formed by mixing a polymer cured by heat and fine conductive particles in a dispersed manner. Thus, when pressure is applied from upper and lower portions of the anisotropic conductive film 4, the conductive particles are exploded, and thus, the polymer in the particles is wholly filled in the double-sided adhesive tape, thereby achieving conductivity and adherence. The conductive particles may include carbon fiber, or a metal such as nickel (Ni), platinum (Pt), or the like or an alloy thereof. The polymer may include styrene butadiene rubber), polyvinyl, butylene, epoxy resin, polyurethane, or acrylic resin.

Next, the FPC 3 is bonded to the film on glass bonding portion 1b of the panel 1 using the pressure tip 200 of the bonding apparatus for the display device according to the exemplary embodiment. In this case, the heat source 110 of the pressure head 100, connected to the pressure tip 200 of the bonding apparatus for the display device according to the exemplary embodiment does not overlap the film on glass bonding portion 1b, and the heat source 110 of the pressure head 100 does not overlap the chip on glass bonding portion 1a.

Accordingly, during the film on glass bonding process, the heat generated from the heat source 110 is hardly transmitted to the chip on glass bonding portion 1a of the panel 1 because the chip on glass bonding portion 1a of the panel 1 is not located under the heat source 110. Accordingly, the chip on glass bonding portion 1a may be prevented from being lifted.

In addition, during the film on glass bonding process, the pressure tip 200 is located so as to not overlap with the chip on glass bonding portion 1a. Thus, during the film on glass bonding process, the chip on glass bonding portion 1a of the panel 1 is not located under the pressure tip 200 to which the heat from the heat source 110 is transmitted. Thus heat of the pressure tip 200 is hardly transmitted to the chip on glass bonding portion 1a of the panel 1, thereby preventing the chip on glass bonding portion 1a from being lifted.

Meanwhile, only the pressure head is disposed at a position biased toward a lower portion of the transfer unit in this exemplary embodiment. An auxiliary pressure head that does not include a heat source may be further provided in the pressure head according to another exemplary embodiment.

Hereinafter, an exemplary embodiment will be described in further detail with reference to FIG. 4.

Figure 4:
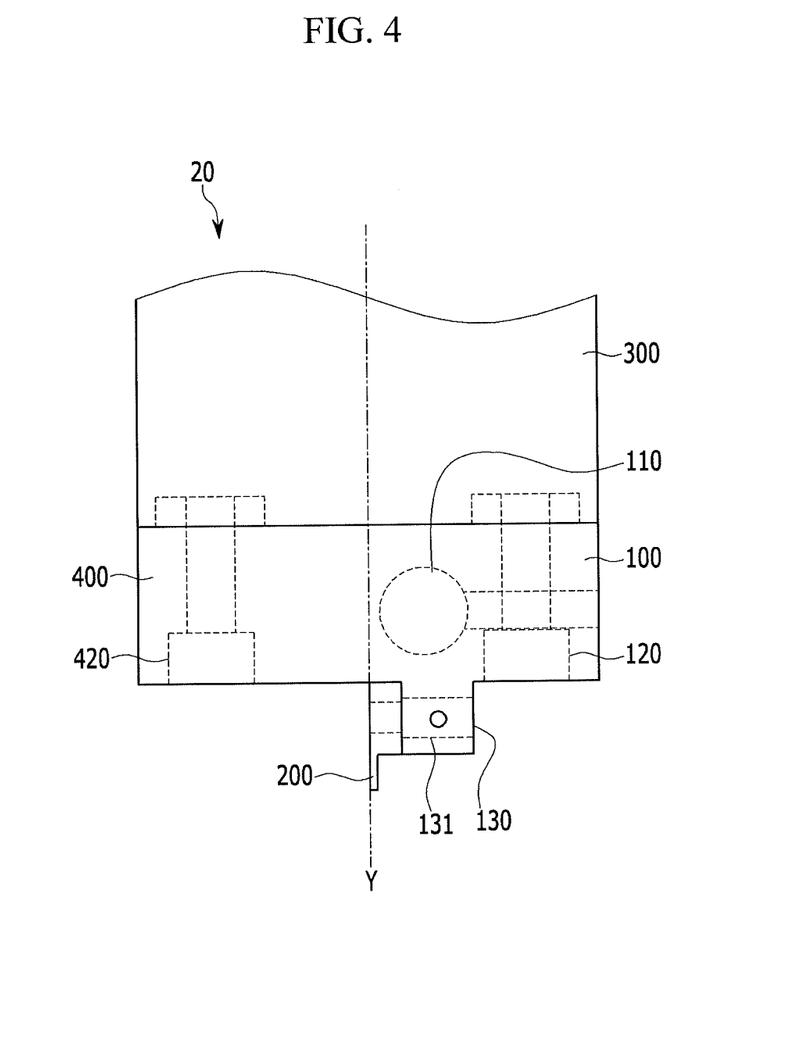
FIG. 4 is an enlarged side view of a pressure of a bonding apparatus for a display device according to another exemplary embodiment.

FIG. 4 is an enlarged side view of a pressure device 20 of a bonding apparatus for a display device according to this exemplary embodiment The second exemplary embodiment shown in FIG. 4 is substantially equivalent to the first exemplary embodiment shown in FIG. 1 and FIG. 2, except that an auxiliary pressure head is further included, and therefore the iterative description will not be repeated.

As shown in FIG. 4, the bonding apparatus for the display device according to the exemplary embodiment further includes an auxiliary pressure head 400 extended in a horizontal direction from a pressure head 100 and attached to a transfer unit 300.

The auxiliary pressure head 400 provides center of mass biased by the pressure head 100 so that the pressure head 100 can be further stably fixed to the transfer unit 300. In such an auxiliary pressure head 400, an auxiliary connection member 420 is provided to fix the auxiliary pressure head 400 to the transfer unit 300.

No additional heat source 110 is provided in the auxiliary pressure head 400. Accordingly, a chip on glass bonding portion 1a of a panel 1 is not located under the heat source 110 during a film on glass bonding process. Heat generated from the heat source 110 is hardly transmitted to the chip on glass bonding portion 1a, and the chip on glass bonding portion 1a may be prevented from being lifted.

Figure 5:
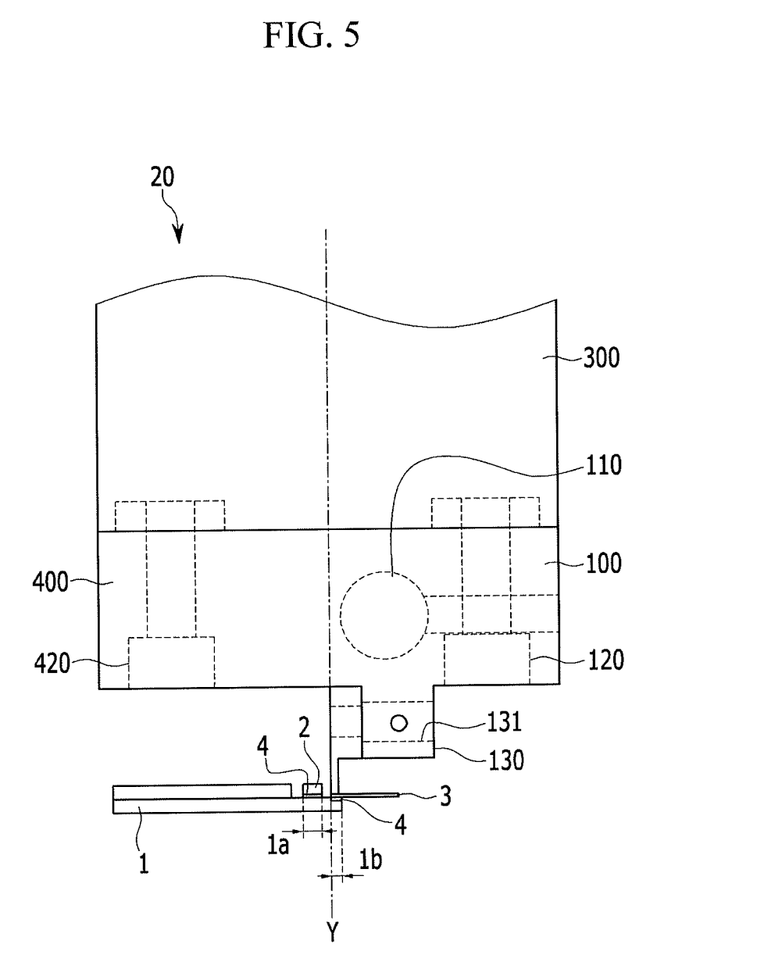
FIG. 5 is a side view of a bonding method using the bonding apparatus for the display device according to the exemplary embodiment of FIG. 4.

A bonding method using the bonding apparatus for the display device according to the exemplary embodiment will be described in further detail with reference to FIG. 5.

First, a driving chip 2 is bonded to the chip on glass bonding portion 1a of the panel 1. Next, a FPC 3 is located in the film on glass bonding portion 1b of the panel 1. Then, the FPC 3 is bonded to the film on glass bonding portion 1b of the panel 1 using a pressure tip 200 of the bonding apparatus for the display device. In this case, no additional heat source is provided in the auxiliary pressure head 400 of the bonding apparatus for the display device according to this exemplary embodiment. Accordingly, the chip on glass bonding portion 1a of the panel 1 is not located under the heat source 110 during the film on glass bonding process. Heat generated from the heat source 110 can be hardly transmitted to the chip on glass bonding portion 1a of the panel 1, and the chip on glass bonding portion 1a may be prevented from being lifted.

The auxiliary pressure head that does not include a heat source is further provided in the pressure head in this exemplary embodiment. However, an auxiliary head source disposed higher than a heat source may be provided in the auxiliary pressure head according to another exemplary embodiment.

Hereinafter, another exemplary embodiment will be described in further detail with reference to FIG. 6.

Figure 6:
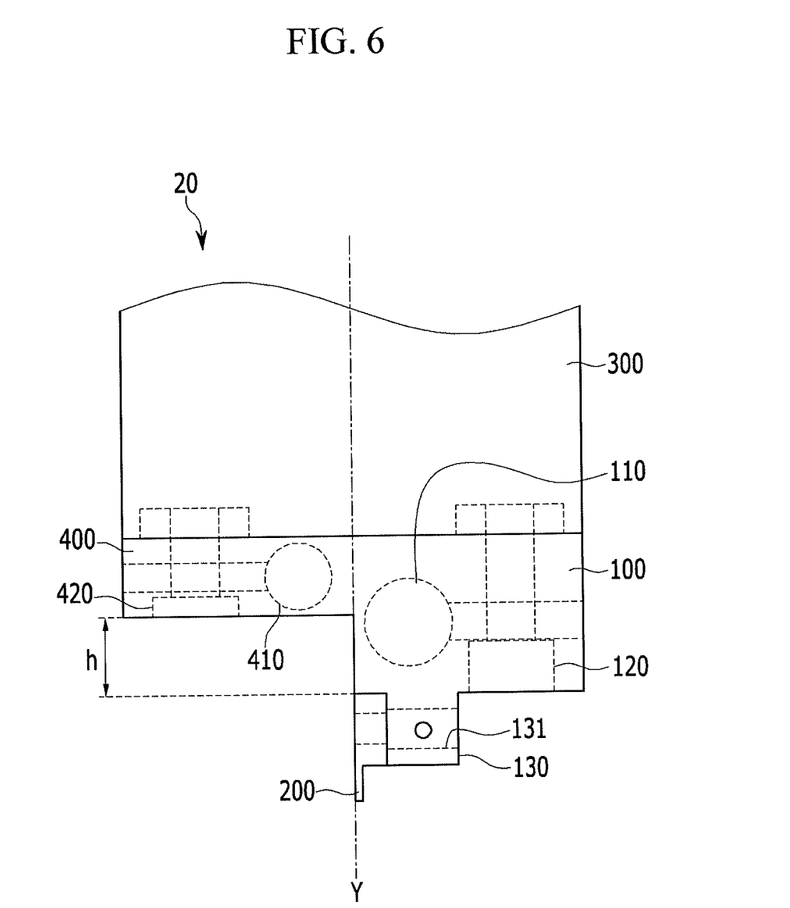
FIG. 6 is an enlarged side view of a pressure of a bonding apparatus for a display device according to another exemplary embodiment.

FIG. 6 is an enlarged side view of a pressure device 20 of a bonding apparatus for a display device according to this exemplary embodiment.

The exemplary embodiment shown in FIG. 6 is substantially equivalent to the exemplary embodiment shown in FIG. 4, except that an auxiliary heat source is disposed higher than a heat source in an auxiliary pressure head, and therefore the iterative description will not be repeated.

As shown in FIG. 6, an auxiliary heat source 410 is provided in an auxiliary pressure head 400 of the bonding apparatus for the display device according to this exemplary embodiment to assist the heat supply. Such an auxiliary heat source 410 is disposed higher than a heat source 110. Thus, during a film on glass bonding process, heat generated from the auxiliary heat source 410 is hardly transmitted to a chip on glass bonding portion 1a of a panel 1, and the chip on glass bonding portion 1a may be prevented from being lifted.

In addition, a bottom side of the auxiliary pressure head 400 is higher by a predetermined height h than a bottom side of the pressure head 100. Thus, during the film on glass bonding process, heat of the auxiliary pressure head 400 is hardly transmitted to the chip on glass bonding portion 1a of the panel 1, and the chip on glass bonding portion 1a may be prevented from being lifted.

Figure 7:
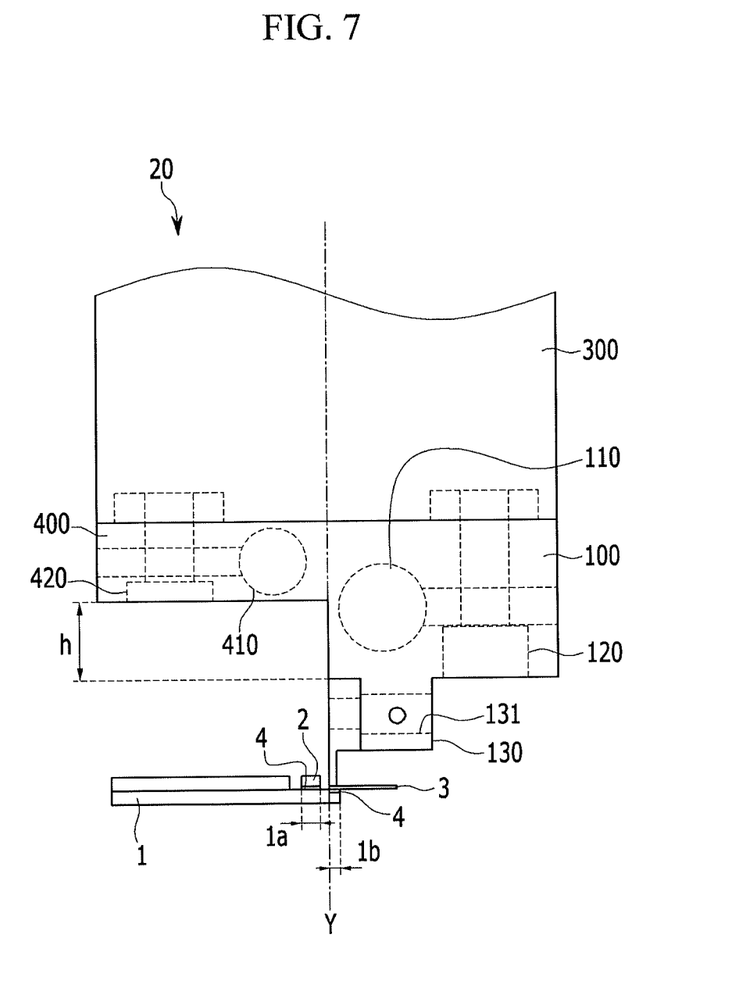
FIG. 7 is a side view of a bonding method using the bonding apparatus for the display device according to the exemplary embodiment of FIG. 6.

A bonding method using the bonding apparatus for the display device according to this exemplary embodiment will be described in further detail with reference to FIG. 7.

First, a driving chip 2 is bonded to the chip on glass bonding portion 1a of the panel 1. Next, a FPC is located in the film on glass bonding portion 1b of the panel 1. Then, the FPC 3 is bonded to the film on glass bonding portion 1b of the panel 1 using a pressure tip 200 of the bonding apparatus for the display device. In this case, the auxiliary heat source 410 provided in the auxiliary pressure head 400 of the bonding apparatus for the display device according to this exemplary embodiment is disposed higher than the heat source 110. Accordingly, during the film on glass bonding process, heat generated from the auxiliary heat source 410 is hardly transmitted to the chip on glass bonding portion 1a of the panel 1, and the chip on glass bonding portion 1a may be prevented from being lifted.

By way of summation and review, a pressure tip of a bonding apparatus used for acquiring good quality of a bonding characteristic may have various types in shape, width, and length. For providing a stable bonding quality, it is desirable that the bonding characteristic be assured and that heat transfer to a bonding portion of the chip on glass and a polarization film be reduced or prevented.

During a film on glass bonding process, there is a risk that heat generated from the bonding apparatus could be transferred to an adjacent chip on glass bonding portion that should be prevented from receiving heat higher than a predetermined temperature, such that the chip on glass bonding portion could be lifted, thereby causing a failure.

For example, during a film on glass bonding process, heat generated from a pressure head may be transferred to a chip on glass bonding portion adjacent to a lower portion of the pressure head so that the chip on glass bonding portion is lifted. In addition, when the pressure tip has a wide width, heat generated from the pressure tip may be transmitted to the chip on glass bonding portion so that the chip on glass bonding portion is lifted.

When the chip on glass bonding portion is lifted, indentation of the chip on glass bonding portion may become obscure so that an electric connection may be disconnected in a portion having a narrow bonding gap, such as a fragile edge part of the chip on glass bonding portion. It may be possible to prevent the chip on glass bonding portion from being lifted by increasing a gap between the FPC and the chip on glass bonding portion. However, in this case, dead space may be increased.

According to embodiments, the pressure head of the bonding apparatus for the display device may overlap the pressure tip. The heat source provided in the pressure tip may be located in an upper portion of the pressure tip so that the chip on glass bonding portion of the panel is not located under the heat source during the film on glass bonding process. Accordingly, heat generated from the heat source may hardly be transmitted to the chip on glass bonding portion, thereby reducing the possibility of or preventing the chip on glass bonding portion from being lifted.

Further, there may be no need of increasing a gap between the FPC and the chip on glass bonding portion to prevent the chip on glass bonding portion from being lifted, and accordingly an increase in dead space may be avoided.

While this disclosure has been described in connection with what is presently considered to be practical exemplary embodiments, it is to be understood that the scope thereof is not limited to the disclosed embodiments, but, on the contrary, is intended to cover various modifications and equivalent arrangements included within the spirit and scope of the appended claims.

What is claimed is:

1. A bonding apparatus for a display device, the bonding apparatus comprising:
    a film bonding device configured to attach an anisotropic conductive film to a panel; and
    a pressure device configured to bond a driving chip and a flexible printed circuit to the panel,
    wherein:
    the pressure device includes:
        a pressure head including a heat source, the heat source being located in the pressure head,
        a pressure tip attached to a bottom side of the pressure head, the pressure tip being configured to press the flexible printed circuit to the panel, and
        a transfer unit attached to an upper side of the pressure head, the transfer unit being configured to transfer the pressure head,
        wherein the heat source is located over the pressure tip, and is disposed at a position biased toward one side of the transfer unit with reference to a center axis of the transfer unit, and the pressure tip is located on a center axis of the transfer unit.

2. The bonding apparatus as claimed in claim 1, wherein the pressure head is disposed at the position biased toward one side of the transfer unit with reference to the center axis of the transfer unit.

3. The bonding apparatus as claimed in claim 2, wherein the pressure head overlaps the pressure tip.

4. The bonding apparatus as claimed in claim 3, further comprising a tip fixing member fixing the pressure tip to the pressure head.

5. The bonding apparatus as claimed in claim 4, wherein the tip fixing member simultaneously contacts a bottom side of the pressure head and a side of the pressure tip.

6. The bonding apparatus as claimed in claim 4, further comprising an auxiliary pressure head extended in a horizontal direction from the pressure head and attached to the transfer unit.

7. The bonding apparatus as claimed in claim 6, wherein an auxiliary heat source is provided in the auxiliary pressure head.

8. The bonding apparatus as claimed in claim 7, wherein a bottom side of the auxiliary pressure head is disposed higher than a bottom side of the pressure head.

9. The bonding apparatus as claimed in claim 8, wherein the auxiliary heat source is disposed higher than the heat source.

10. A film pressure method using the bonding apparatus for a display device as claimed in claim 1, the method comprising:
    bonding a driving chip to a chip on glass bonding portion of a panel;
    positioning a flexible printed circuit on a film on glass bonding portion of the panel; and
    bonding the flexible printed circuit to the film on glass bonding portion of the panel using the pressure tip of the bonding apparatus for the display device,
    wherein, in the bonding of the flexible printed circuit, the heat source of the pressure head connected to the pressure tip of the bonding apparatus for the display device is in a non-overlapping relationship with the chip on glass bonding portion.

11. The film pressure method as claimed in claim 10, wherein the heat source of the pressure head is in a non-overlapping relationship with the film on glass bonding portion.

12. The film pressure method as claimed in claim 11, wherein:
    the pressure head of the bonding apparatus for the display device is disposed at a position biased toward one side of the transfer unit with reference to the center axis of the transfer unit, and
    the bonding apparatus further includes an auxiliary pressure head extended in a horizontal direction from the pressure head and having an auxiliary heat source provided therein,
    wherein the auxiliary heat source is disposed higher than the heat source.

13. The film pressure method as claimed in claim 11, wherein the pressure tip does not overlap the chip on glass bonding portion.

* * * * *